United States Patent [19]
Yilmaz

[11] Patent Number: 5,430,314
[45] Date of Patent: Jul. 4, 1995

[54] POWER DEVICE WITH BUFFERED GATE SHIELD REGION

[75] Inventor: Hamza Yilmaz, Saratoga, Calif.

[73] Assignee: Siliconix Incorporated, Santa Clara, Calif.

[21] Appl. No.: 873,423

[22] Filed: Apr. 23, 1992

[51] Int. Cl.$^6$ .................... H01L 29/10; H01L 29/78; H01L 27/14; H01L 31/00
[52] U.S. Cl. ................... 257/328; 257/294; 257/337; 257/340; 257/341
[58] Field of Search ............... 357/23.4; 257/294, 328, 257/337, 340, 341

[56] References Cited

U.S. PATENT DOCUMENTS

| | | | |
|---|---|---|---|
| 4,532,534 | 7/1985 | Ford et al. | 357/23.4 |
| 4,631,564 | 12/1986 | Neilson et al. | 357/23.4 |
| 4,819,044 | 4/1989 | Murakami . | |
| 4,985,739 | 1/1991 | Lapham et al. | 357/22 |
| 5,136,349 | 8/1992 | Yilmaz et al. | 357/23.4 |

FOREIGN PATENT DOCUMENTS

| | | |
|---|---|---|
| 293846A1 | 5/1988 | European Pat. Off. . |
| 335750A3 | 4/1989 | European Pat. Off. . |
| 60-249367 | 12/1985 | Japan . |
| 61-80860 | 4/1986 | Japan . |
| 61-84865 | 4/1986 | Japan . |
| 63-73564 | 4/1988 | Japan . |
| 63-84070 | 4/1988 | Japan . |
| 1-276770 | 11/1989 | Japan . |
| 2-35780 | 2/1990 | Japan . |
| 3173180 | 7/1991 | Japan . |
| 2137811 | 10/1984 | United Kingdom . |
| 2166290 | 4/1986 | United Kingdom . |

OTHER PUBLICATIONS

Conference Record of the 1986 IEEE Industry Applications Society Annual Meeting, vol. 1, Oct. 1986, Denver, Colo., "Optimization of Power MOSFET Body Diode for Speed and Ruggedness", by Hamza Yilmaz et al., pp. 330-334.

"Design Optimization of Power MOSFET With Built-In Flyback Diode", by Yilmaz et al., Power Electronics Semiconductor Department, General Electric Co., Syracuse, N.Y., pp. 1-6.

"MOSPOWER Applications Handbook", Severns et al., Siliconix Incorporated, 1984, pp. 5-57 through 5-64.

"Semiconductor Power Devices", Sorab K. Ghandhi, Rensselaer Polytechnic Institute, John Wiley & Sons, N.Y., 1977, pp. 1-17 and 172-176.

Primary Examiner—Sara W. Crane
Assistant Examiner—Valencia M. Wallace
Attorney, Agent, or Firm—Skjerven, Morrill, MacPherson, Franklin & Friel

[57] ABSTRACT

The present invention provides a gate buffer region between a gate shield region and active cells of a power device. This gate buffer region may, for example, be a relatively narrow, strip-like doped region which extends into an epitaxial layer from an upper surface of the epitaxial layer. The gate shield region is connected to a source electrode of the power device via a relatively high impedance connection. The gate buffer region, on the other hand, is connected to the source electrode with a relatively low impedance connection. This relatively low impedance connection may, for example, be a substantially direct metallized connection from a metal source electrode to the gate buffer region at the surface of the epitaxial layer.

15 Claims, 11 Drawing Sheets

METAL

P+ DIFFUSION

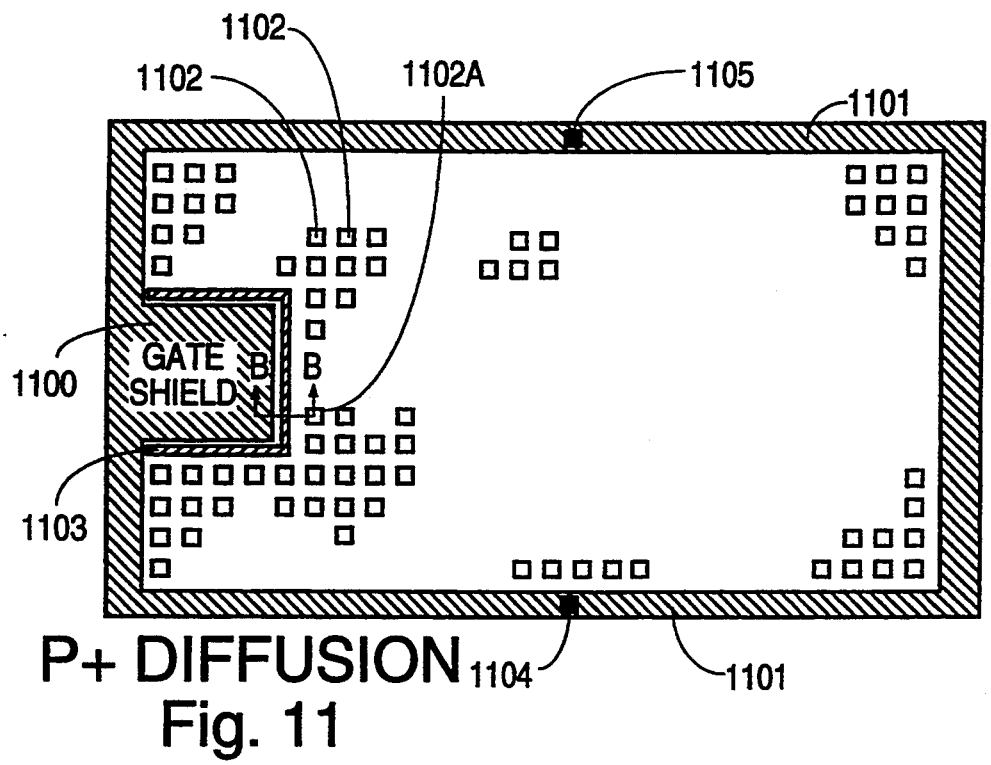
P+ DIFFUSION
Fig. 11
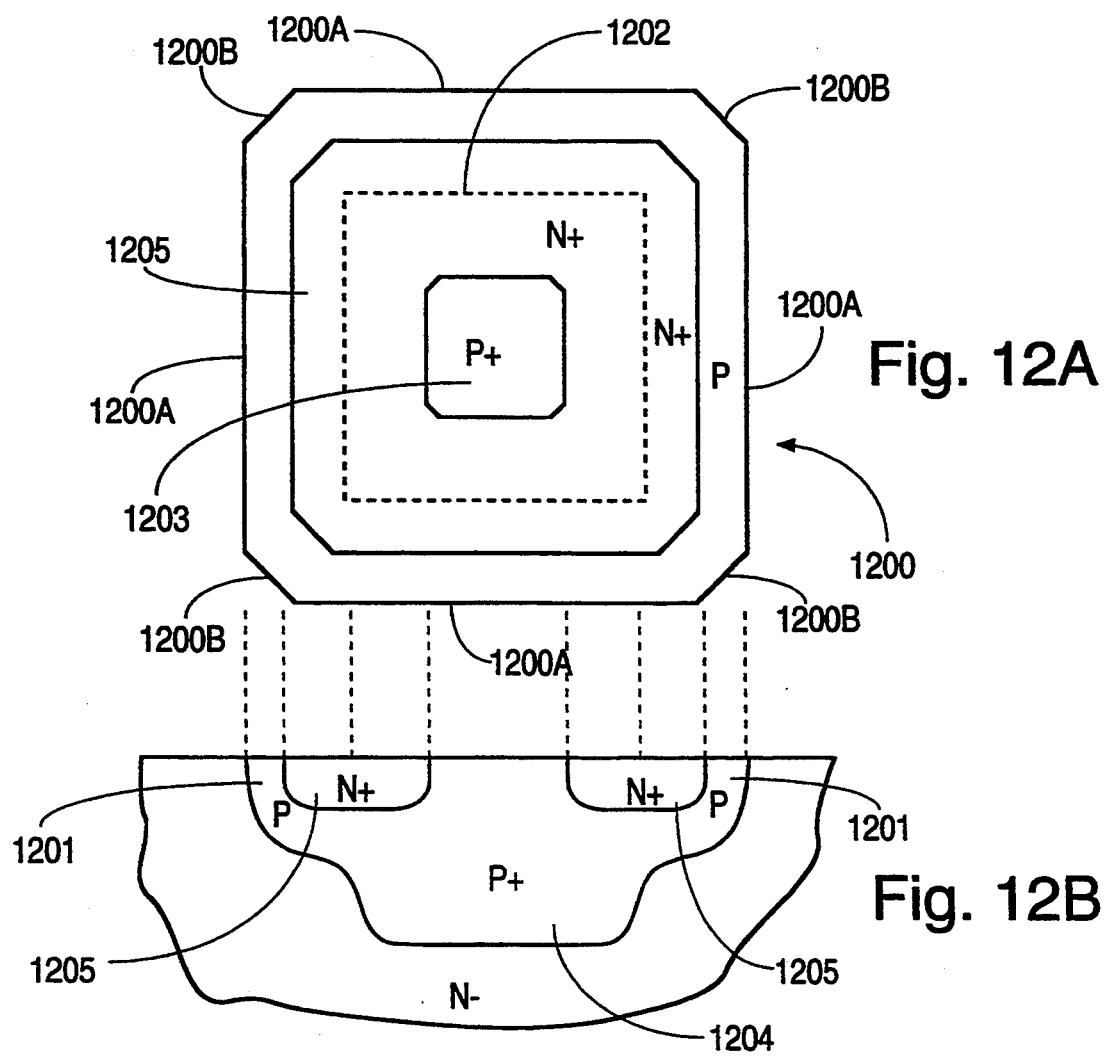
Fig. 12A
Fig. 12B

POWER DEVICE WITH BUFFERED GATE SHIELD REGION

FIELD OF THE INVENTION

This invention relates to preventing the failure of power devices such as power metal oxide silicon field effect transistors (MOSFETs) and insulated gate bipolar transistors (IGBTs). More particularly, this invention relates to preventing the failure of active transistors in the vicinity of a gate shield region during high current conditions such as diode recovery.

BACKGROUND INFORMATION

FIG. 1 (PRIOR ART) is a cross-sectional view of a vertical power doubly-diffused metal oxide silicon field effect transistor (DMOSFET). Peripheral body region 3 and central body region 10 together form a single body region 12. Voltages present on the gate electrode 1 can induce a conductive channel 2 to be formed in the P peripheral body region 3 beneath oxide layer 4. If such a conductive channel is formed, current can flow from conductive source electrode 5 on the top of the structure, down into N+ region 6, laterally through the conductive channel 2 formed in P peripheral body region 3, down through the N− epitaxial layer 7, down through N+ substrate layer 8, and to conductive drain electrode 9.

A PN junction (a diode) is, however, also present in this structure between body region 12 and the underlying N− epitaxial layer 7. If source electrode 5 is adequately positive with respect to drain electrode 9, the PN junction between body region 12 and N− epitaxial layer 7 may be forward biased. In such a forward biased condition, holes are continuously injected by body region 12 into N− epitaxial layer region 7. These holes travel toward the drain electrode 9. Conversely, electrons present in the epitaxial layer 7 travel in the opposite direction toward the source electrode 5. To improve the clarity of the drawing, only two electrons and two holes are shown in the forward biased structure of FIG. 1.

If, on the other hand, source electrode 5 has a negative potential with respect to drain electrode 9, the PN junction between body region 12 and N− epitaxial layer 7 may be reverse biased. In such reverse bias conditions, the depletion region of the PN junction extends outward into epitaxial layer 7 from body region 12. The outer contour of this depletion region under high reverse bias conditions is indicated in FIG. 1 by reference numeral 11. Before this depletion region expands, however, the electrons and holes present in the epitaxial layer 7 which were responsible for the forward bias current must first be removed. These electrons and holes are removed from both the part of the epitaxial layer which will become the depletion region and also from the part of the epitaxial layer which will not be depleted. These electrons present in epitaxial layer 7 are removed from drain electrode 9 whereas these holes present in epitaxial layer 7 are removed from source electrode 5.

FIG. 2 (PRIOR ART) shows one possible application of the power DMOSFET of FIG. 1. Four DMOSFETs, T1–T4, are arranged in a H-bridge structure between a high voltage source +HV and ground. Diodes D1–D4 represent the PN junctions present in transistors T1–T4, respectively. This H-bridge circuit drives current through an inductance 25 which may, for example, be the drive coil of an electric motor. To drive current from node N1 through inductance 25 and to node N2, for example, transistors T1 and T4 are turned on while transistors T2 and T3 are turned off. Current therefore flows from high positive voltage +HV, to node N1, through inductance 25, to node N2, and through transistor T4, and to ground. Diode D2 of transistor T2 is reverse biased.

If the motor being driven is then to be turned off, transistors T1 and T4 are turned off. Due to the inductive load of inductance 25, however, the voltage on node N1 may rapidly go negative to a voltage below ground. Diode D2 will therefore become forward biased and will conduct current from ground, to node N1, and through inductance 25. Once the magnetic field of inductance 25 dies, the voltage of node N1 returns to a positive voltage, thereby reverse biasing diode D2 once more.

FIGS. 3A and 3B depict the current and voltage relationships across a diode under such conditions of rapid switching from a forward biased condition to a reverse biased condition. When the diode is forward biased, forward current $I_F$ flows in the diode. During this forward bias time, holes are continuously injected by body region 12 into N− epitaxial layer region 7 such as shown in FIG. 1. Similarly, electrons continuously flow in the opposite direction into body region 12 and toward the source. Therefore, at time 30 when the voltage across the PN junction structure of FIG. 1 is reversed, some electrons and holes are located in layer 7 between the source 5 and drain 9. Under the reverse bias potential, these charges reverse their direction of travel, the holes rushing back to body region 12 and the electrons rushing back toward the drain 9. This rapid reversal of current flow due to the removal of charge from the epitaxial layer 7 is represented in FIG. 3A by the negative current spike 31. This phenomena involving this negative current is known as "diode recovery" and the negative current spike is known as "diode recovery current". Once these holes and electrons which were present in layer 7 due to the forward current have been removed from the epitaxial layer 7, the diode recovery current stops and the depletion region present at the PN junction expands. The expanding depletion region gives rise to a depletion current which flows in a direction opposite to the diode recovery current. When the depletion region stops expanding, the corresponding depletion current stops, and current flow in the diode dies down to substantially zero current as depicted by reference numeral 32 in FIG. 3A.

FIG. 4 (PRIOR ART) shows two layers of a power device, a metal gate electrode 40 and a metal source electrode 41. Metal gate electrode 40 comprises a gate pad 42 and three gate electrode fingers 43A–43C. Each of the gate fingers extends over a portion of the active region of the device. Metal source electrode 41 comprises a source pad 44, a portion 45 which extends over the active region of the device, and a band of termination metal 46 which surrounds the active region of the device.

FIG. 5 (PRIOR ART) shows a plurality of diffused active cells 50 of the active region of the power device of FIG. 4, a gate shield region 51, and a connected field ring 52 which surrounds the active region.

FIG. 6 (PRIOR ART) is a simplified cross-sectional view of the structure of FIG. 5 taken along cross-sectional line A—A. Source electrode 5 represents a portion of portion 45 of source electrode 41 in FIG. 4. In FIG. 6, a sidewall 51A of the gate shield region 51 is laterally disposed from two active cells 50A and 50B of the active region. Under forward bias conditions, both the P+ gate shield region 51 and the body regions of the two active cells 50A and 50B continuously inject holes into the epitaxial layer 7. Electrons flow the opposite direction toward the source electrode 5. These moving holes and electrons constitute a forward bias current.

When the voltage between the source electrode 5 and drain electrode 9 is rapidly reversed, however, some of these electrons and holes are still passing through epitaxial layer 7. These electrons and holes reverse direction and are expelled from the epitaxial layer 7 as diode recovery current. As shown in FIG. 6, some of the holes in the epitaxial layer flow upward into the P+ gate shield region 51 whereas others of the holes flow upward into the body regions of active cells 50A and 50B. Although electron flow also comprises part of the diode recovery current as explained above, these electrons have been omitted from FIG. 6 to improve the clarity of the illustration.

In the prior art device of FIG. 6, however, there is a localized large current flow flowing into the left side of the peripheral body region 3 of active cell 50A. A disproportionately large number of holes from underneath the P+ gate shield region 51 flow laterally to the right and into the left side of active cell 50A which is closest to the P+ gate shield 51. This large localized current arises due to the fact that a larger impedance R exists between P+ gate shield region 51 and the source electrode 5 than exists between the peripheral body region 3 and the source electrode 5. While the metal of the source electrode 5 makes direct contact with the central body region of each active cell such as active cell 50A, the gate shield 51 is connected to source electrode 5 at a location significantly spaced from the gate pad region of the device. FIGS. 4 and 5 show contacts 47 and 48 connecting the gate shield region 51 to source electrode 41. The relatively large impedance R between the P+ gate shield 51 and the source electrode 5 is due in part to the relatively long and thin portions of the field ring 52 which connect the P+ gate shield region 51 to contacts 47 and 48.

Due to this relatively large impedance R, the same initial flow of charge into the P+ gate region 51 and into body region 12 of active cell 50A during diode recovery will result in the voltage of the P+ gate region 51 being less reverse biased than is the body region 12 of active cell 50A. As a consequence, fewer of the holes under the P+ gate shield region 51 will be absorbed into the P+ gate shield region than are absorbed into the more highly reverse biased side of body region 12 of active cell 50A adjacent to the gate shield region 51. The disparity between the voltage levels on the gate shield 51 and the body region 12 of active cell 50A therefore is magnified further.

This larger diode recovery current flowing into the left side of active cell 50A is larger than the diode recovery current which flows into the other active cells (such as active cell 50B) which are located farther toward the center of the active region. As seen in FIG. 6, the right side of active cell 50A and the left and right sides of active cell 50B in the interior of the active region absorb holes from the epitaxial layer 7 in a substantially uniform fashion. Accordingly, there is not a localized concentration of hole flow like there is into the left side of active cell 50A adjacent the P+ gate shield region 51.

The vertical DMOSFET structure of FIG. 6, however, also contains a parasitic bipolar transistor structure. N+ source region 6 of active cell 50A comprises an emitter, peripheral body region 3 or central body region 10 comprises a base, and N− epitaxial layer 7 and N+ substrate 8 comprise a collector. If an adequately large spike of diode recovery current surges through peripheral body region 3 or central body region 10 to the N+ region 6, the base of the parasitic bipolar transistor may become forward biased with respect to the emitter. The parasitic transistor may therefore be turned on.

FIG. 9 represents a typical characteristic of the collector-to-emitter current $I_{CE}$ versus the collector-to-emitter voltage $V_{CE}$ of a bipolar transistor. Because there is substantially no base current in the diode recovery situation depicted in FIG. 6, the curve applicable to operation of the parasitic bipolar transistor in FIG. 6 is the curve labelled $I_B=0$. Because the collector-to-emitter voltage $V_{CE}$ of the transistor of FIG. 6 is substantially fixed by the circuit in which the DMOSFET device is operating, the parasitic bipolar transistor typically operates along a vertical line such as dashed vertical line 90 in FIG. 9. Accordingly, if the magnitude of the localized diode recovery current flowing from the base to the emitter exceeds current $I_1$, the parasitic bipolar transistor enters a negative resistance area of operation. As a consequence, the collector-to-emitter current $I_{CE}$ climbs rapidly due the negative resistance until the collector-to-emitter current reaches the very high current $I_2$ which is once again in the positive resistance area of operation. This current $I_2$ is, however, so great that the parasitic transistor is quickly destroyed. Accordingly, it is seen that once a single parasitic transistor of a power device is turned on, that particular parasitic transistor will attempt to conduct substantially all the diode recovery current. As a result, one parasitic transistor located in an active cell adjacent to the gate shield region will turn on and remain on in diode recovery situations so that it destroys itself, thereby causing the entire power device to fail.

Two structures used today in locations such as location A—A of the conventional power devices of FIG. 5 are shown in FIGS. 7 and 8.

The structure of FIG. 7 (PRIOR ART) provides a direct metal connection between the metal source electrode 5 and the P+ gate shield region 51. This connection reduces or eliminates the disparity in impedance between the P+ gate shield region 51 to source electrode 5 connection and the peripheral body region 3 and/or central body region 10 to source electrode 5 connection. The structure of FIG. 7 has a drawback, however, in that the entire undersurface of the large P+ gate shield region 51 is now an effective injector of charge into the underlying epitaxial layer 7 when the PN junction between P+ gate shield region 51 and N− epitaxial layer 7 is forward biased. This structure therefore results in a great number of charges being injected underneath the gate shield region 51 which contributes to the magnitude of the diode recovery current when the polarity of the source-to-epitaxial layer voltage is reversed.

The structure of FIG. 8 (PRIOR ART) is the structure shown in simplified FIG. 6 and described above. This structure does not have a large gate shield region 51 directly connected to the source electrode 5. This structure therefore does not inject as many carriers into the epitaxial layer 6 during forward bias conditions. The structure of FIG. 8, however, has a drawback in that it involves the relatively large impedance R between the gate shield region 51 and the source electrode 5 which results in a concentration of diode recovery current and a turning on of a parasitic bipolar transistor as described above.

SUMMARY OF THE INVENTION

The present invention solves the above described problems attendant in conventional power devices. According to one embodiment of the present invention, a relatively narrow gate buffer region is disposed in the epitaxial layer between the gate shield region and the active cells. This gate buffer region may, for example, be a doped region which extends into the epitaxial layer from an upper surface of the epitaxial layer. A gate shield region of the present invention is connected to a source electrode via a relatively high impedance connection. The gate buffer region, on the other hand, is connected to the source electrode with a relatively low impedance connection. This relatively low impedance connection may, for example, be a substantially direct connection from a metal source electrode to the gate buffer region.

In forward bias conditions, the relatively small size of the gate buffer region in comparison to the relatively large size of the gate shield region allows the gate buffer region to inject only a small number of charges into the underlying epitaxial layer. In conditions of switching from a forward to a reverse bias, the gate buffer region is able to absorb a relatively large diode recovery current flow from under the gate shield region due to the low impedance connection with the source electrode. Furthermore, because the gate buffer region does not contain an internal annular diffused source region like the active cells do, the gate buffer region does not contain any base region of a destructive parasitic bipolar transistor.

BRIEF DESCRIPTION OF THE INVENTION

FIG. 11 is a top down view of a diffusion layer of a power device according to one embodiment of the present invention.

FIG. 12A is a top down view of one possible configuration of an active cell of the power device of FIG. 11.

FIG. 12B is a cross-sectional view of the active cell of FIG. 12A.

DETAILED DESCRIPTION OF PREFERRED EMBODIMENTS

FIG. 11 is a top down view of a diffusion layer of a power device. A rectangularly shaped gate shield region 1100 is integrally formed with a field ring 1101. The field ring 1101 surrounds the active region of the power device. A plurality of active cells 1102 are disposed in the active region of the power device. A gate buffer region 1103 in the shape of a narrow strip-like band is disposed between gate shield region 1100 and the active cells 1102 of the active region.

FIG. 12A is a magnified top down view of one possible configuration of one of the active cells 1102. FIG. 12B is cross-sectional view of this configuration. The outer peripheral boundary 1200 of the P type peripheral body region 1201 has an octagonal shape. Each of the four corners formed by four large sides 1200A is blunted to form an additional small side 1200B. The square dotted line 1202 in FIG. 12A represents the outline of the inner boundary of a contact window through which a metal source electrode contacts N+ source region 1205 and the central part 1203 of P+ type central body region 1204. N+ annular source region 1205 has both an octagonal outer boundary and also an octagonal inner boundary.

Figure 10:
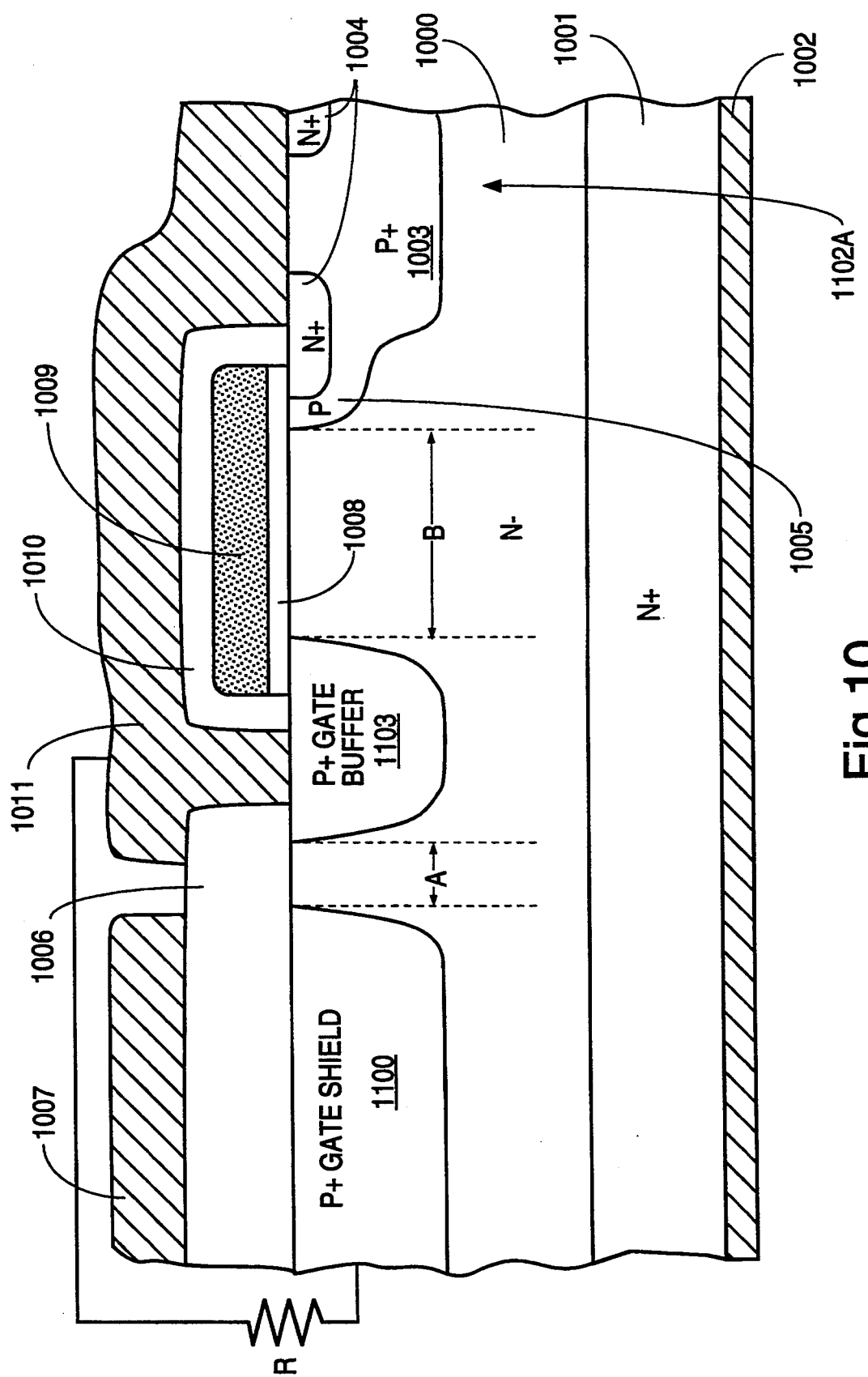
FIG. 10 is a cross-sectional view of one embodiment of the present invention.

FIG. 10 is a cross-sectional view of the present invention taken along line B—B of FIG. 11. This Figure shows a cross-sectional view of a portion of active cell 1102A, gate buffer region 1103, and a portion of gate shield region 1100. As shown in FIG. 10, an N-epitaxial layer 1000 is disposed on an upper surface of a N+ substrate 1001. The N− epitaxial layer may, for example, be approximately 5 microns thick and may be doped with an N type dopant such as phosphorous to an approximate doping concentration of $8E15$ cm$^{-3}$. The N+ substrate 1001 is represented in FIG. 10 as a thin layer for ease of illustration. The N+ substrate 1001 may, however, be considerably thicker than the overlying epitaxial layer 1000. The N+ substrate may, for example, be doped with an N type dopant such as phosphorous to an approximate doping concentration of $5E18$ cm$^{-3}$. A metallized plane, such as a sputtered plane of aluminum, is disposed on the bottom surface of the substrate 1001 to form a drain electrode 1002.

The left hand portion of active cell 1102A is shown on the right of FIG. 10. This active cell has the same configuration as does the active cell shown in FIGS. 12A and 12B. A P+ central body region 1003 extends into the epitaxial layer 1000 from the upper surface of the epitaxial layer 1000 to an approximate depth of 2-5 microns. This P+ type central body region may, for example, be doped with a P type dopant such as boron to a doping concentration of 1E19 cm$^{-3}$. A less heavily doped P type peripheral body region 1005 is disposed around the outer periphery of the P+ type central body region 1003 at the upper surface of the epitaxial layer 1000. Peripheral body region 1005 and central body region 1003 together form the body region of active cell 1102A. An annular N+ source region 1004 is disposed within P+ type central body region 1003 and P type peripheral body region 1005 so that the P type peripheral body region 1005 is disposed between the annular N+ source region 1004 and the epitaxial layer 1000 at the upper surface of the epitaxial layer 1000. Annular N+ source region 1004 may, for example, be doped with an N type dopant such as arsenic to a doping concentration of approximately 1E20 cm$^{-3}$. Annular N+ source region 1004 may, for example, extend 0.5 microns into the epitaxial layer from the upper surface of the epitaxial layer.

A portion of gate shield region 1100 is shown at the left of FIG. 10. Gate shield region 1100 may, for example, be doped with a P type dopant such as Boron to a doping concentration of 5E19 cm$^{-3}$. This gate shield region may, for example, extend from the upper surface of the epitaxial layer 1000 to an approximate depth of 2-5 microns. A thick oxide layer 1006 is disposed over the gate shield region 1100. This oxide layer may, for example, have an approximate thickness of 5,000–10,000 Angstroms. A metal gate pad 1007 is disposed over the top surface of thick oxide layer 1006 so that gate pad 1007 is insulated from the underlying gate shield region 1100.

A gate buffer region 1103 of the present invention is disposed between the gate shield region 1100 of FIG. 10 and the active cell 1102A of FIG. 10. Gate buffer region 1103 may, for example, be doped with a P type dopant such as boron to a doping concentration of 1E18 cm$^{-3}$–5E19 cm$^{-3}$. Gate buffer region 1103 may, for example, extend from the upper surface of the epitaxial layer 1000 to an approximate depth of 2-5 microns. From a top down perspective, gate buffer region 1103 may, for example, be shaped substantially as three sides of a rectangle to separate the rectangular gate shield region 1100 from the active cells in the active region of the power device as shown in FIG. 11.

A thin gate oxide layer 1008 is disposed over the upper surface of epitaxial layer 1000 to extend from a location over P+ gate buffer region 1103, across the epitaxial layer between the gate buffer 1103 and the active cell 1102A, over the P type peripheral body region 1005 of active cell 1102A, and over a part of annular N+ source region 1004 of active cell 1102A. From a top down perspective, this gate oxide 1008 appears in the active region substantially as a sheet of oxide. This sheet of oxide has a plurality of square-shaped windows formed in it, one for each of the active cells. Oxide layer 1008 may, for example, have a thickness of 500 Angstroms. A layer of gate polysilicon 1009 is disposed over the thin gate oxide 1008. This layer of gate polysilicon may, for example, have an approximate thickness of 5,000 Angstroms. From a top down perspective, this polysilicon gate layer 1009 has the same approximate shape as does the thin gate oxide layer 1008 it covers.

Figure 1:
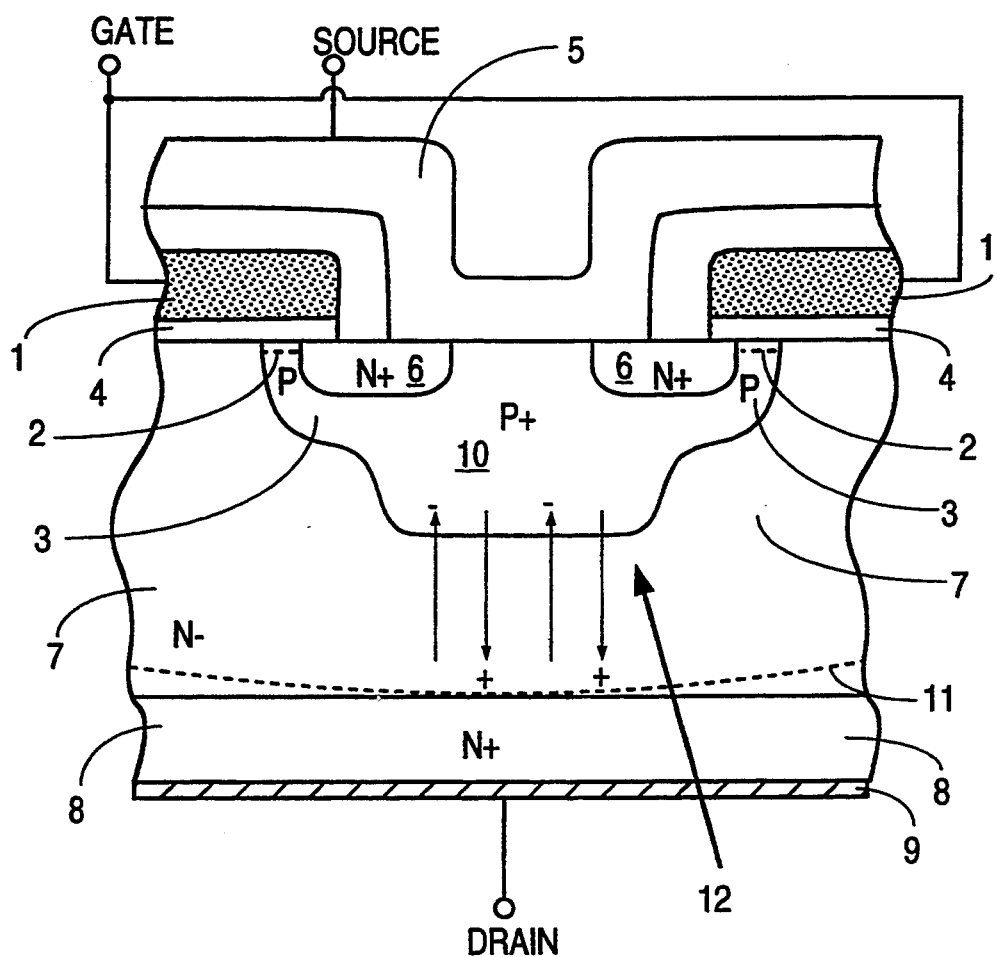
FIG. 1 (PRIOR ART) is a cross-sectional view of a conventional DMOSFET active cell having a built-in diode.
Figure 2:
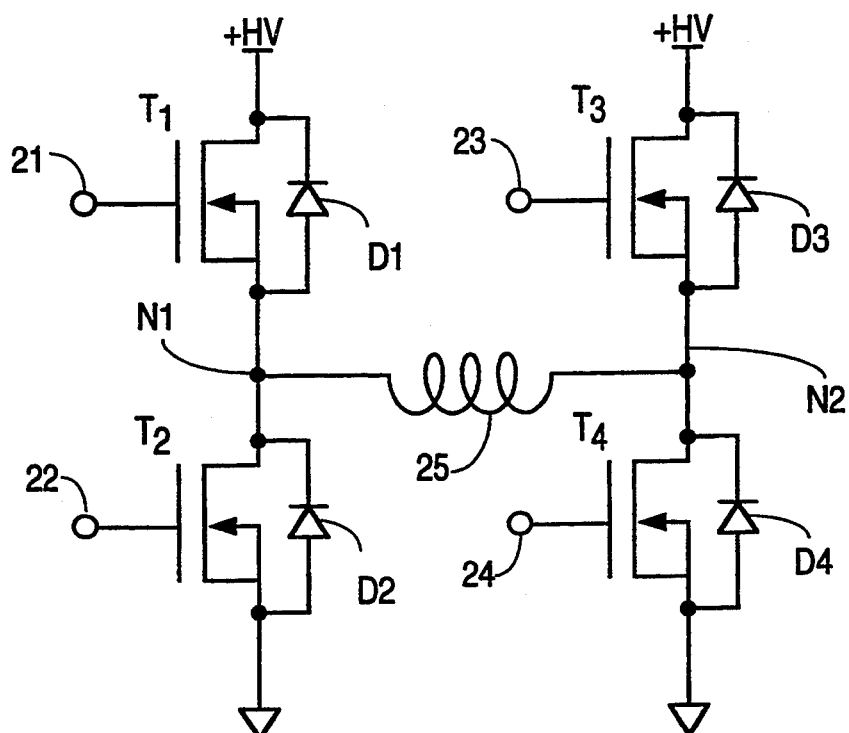
FIG. 2 (PRIOR ART) is a circuit diagram showing an application of a conventional DMOSFET such as the DMOSFET of FIG. 1.
Figure 3A:
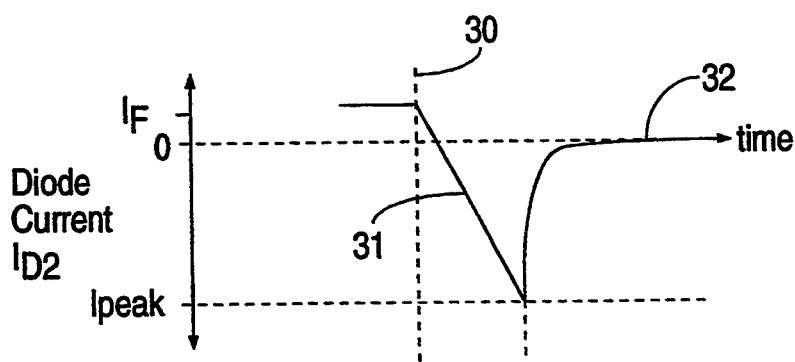
FIGS. 3A and 3B (PRIOR ART) represent the diode current and the diode voltage of built-in diode D2 of DMOSFET T2 of FIG. 2.
Figure 3B:
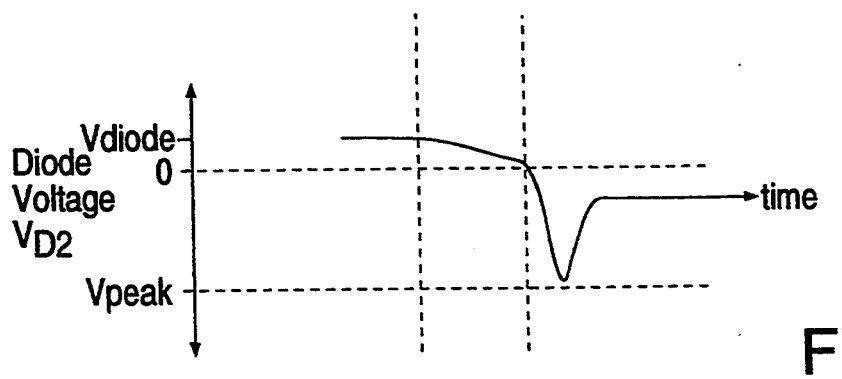
Figure 4:
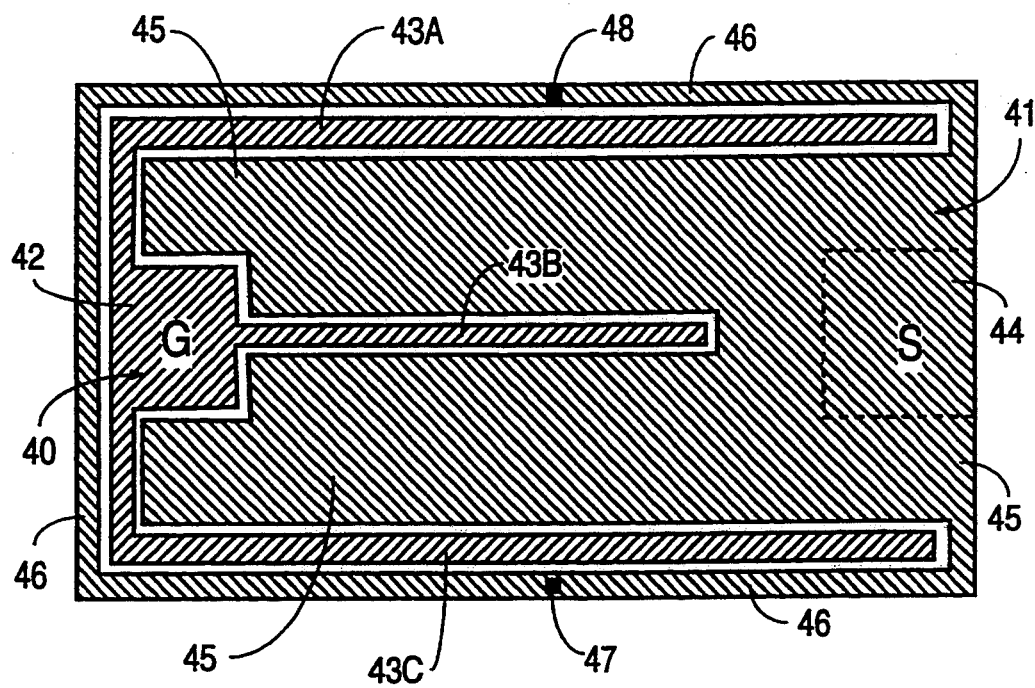
FIG. 4 (PRIOR ART) is a top down view of a source metal layer and a gate metal layer of a power device.
Figure 5:
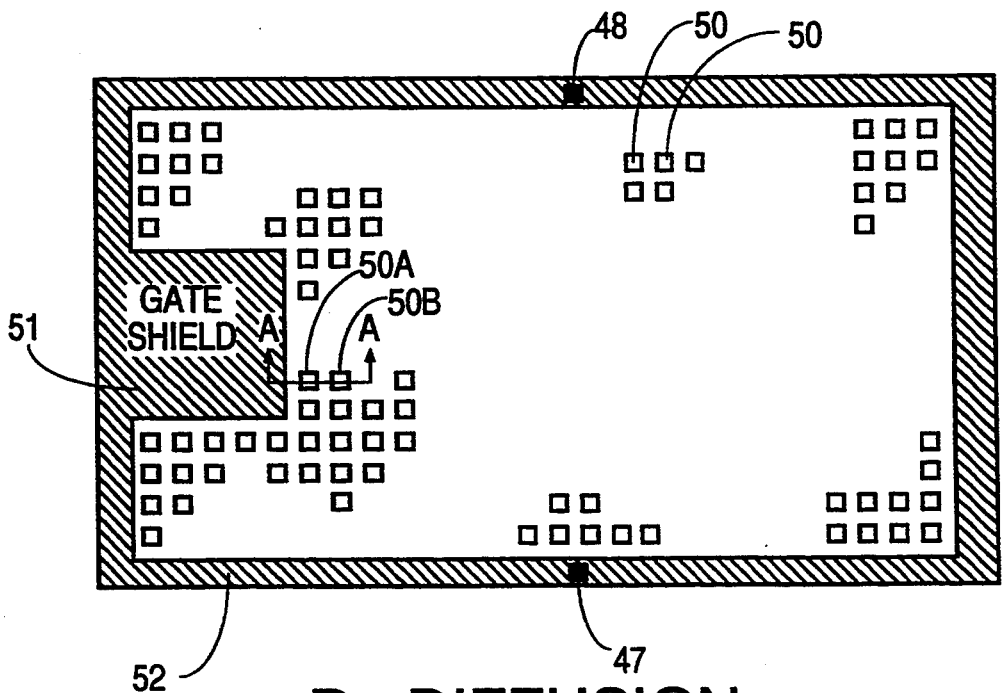
FIG. 5 (PRIOR ART) is a top down view of a P+ diffusion layer of the power device of FIG. 4.
Figure 6:
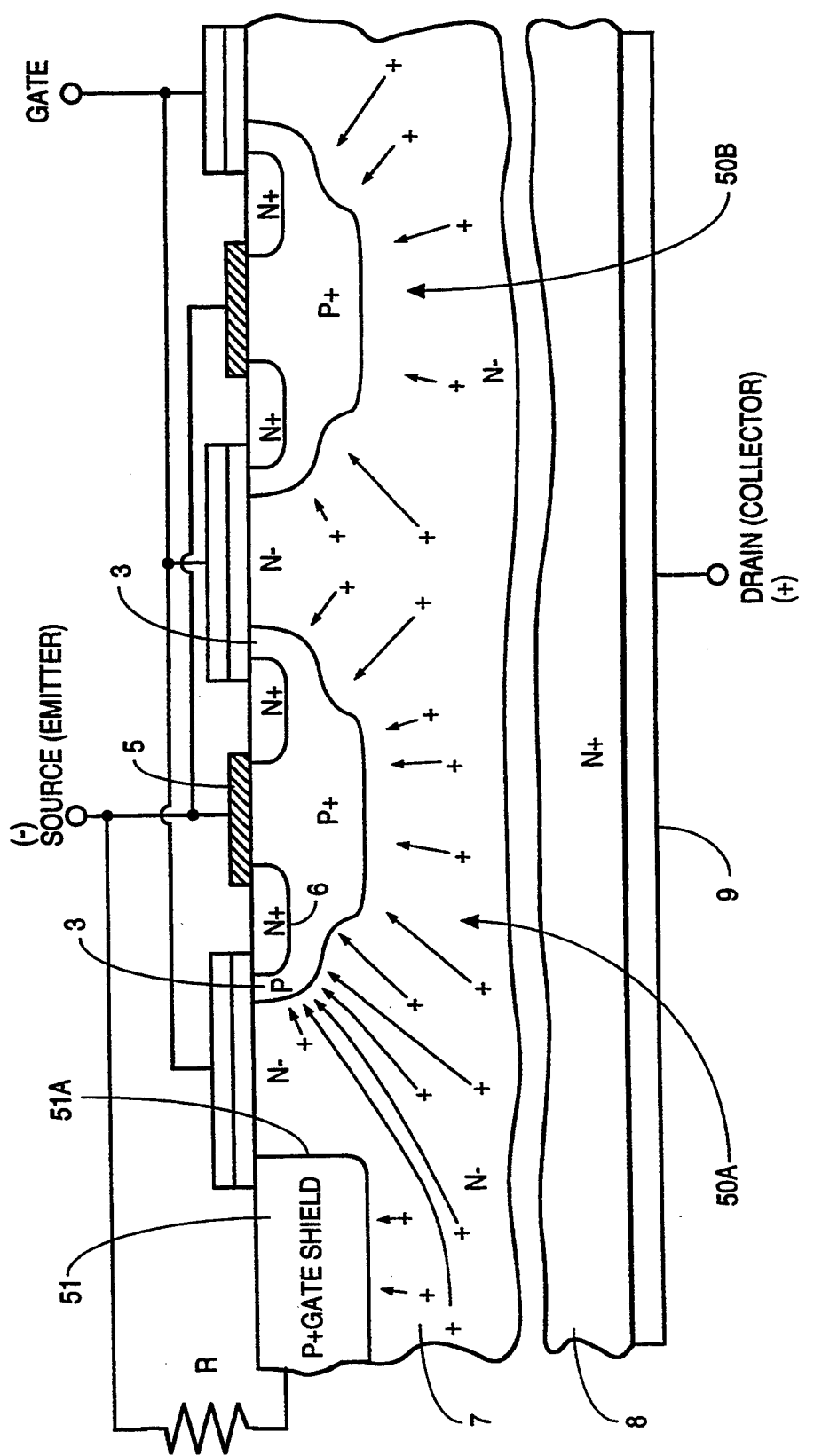
FIG. 6 (PRIOR ART) is a simplified cross-sectional view taken along sectional line A—A of FIG. 5.
Figure 7:
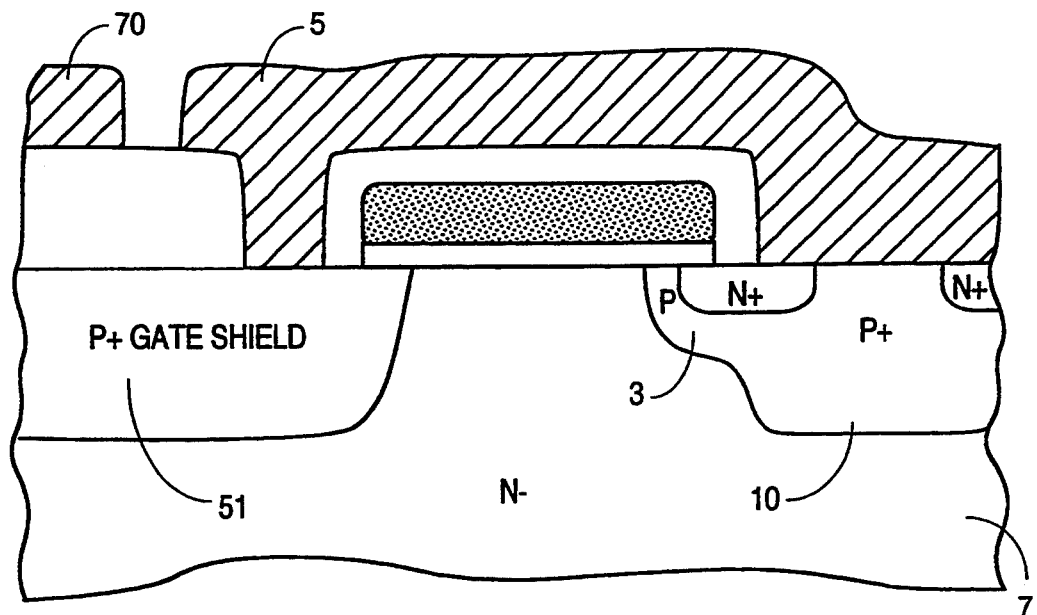
FIG. 7 (PRIOR ART) is a cross-sectional view of a first structure which has conventionally been used in locations such as location A—A in FIG. 5.
Figure 8:
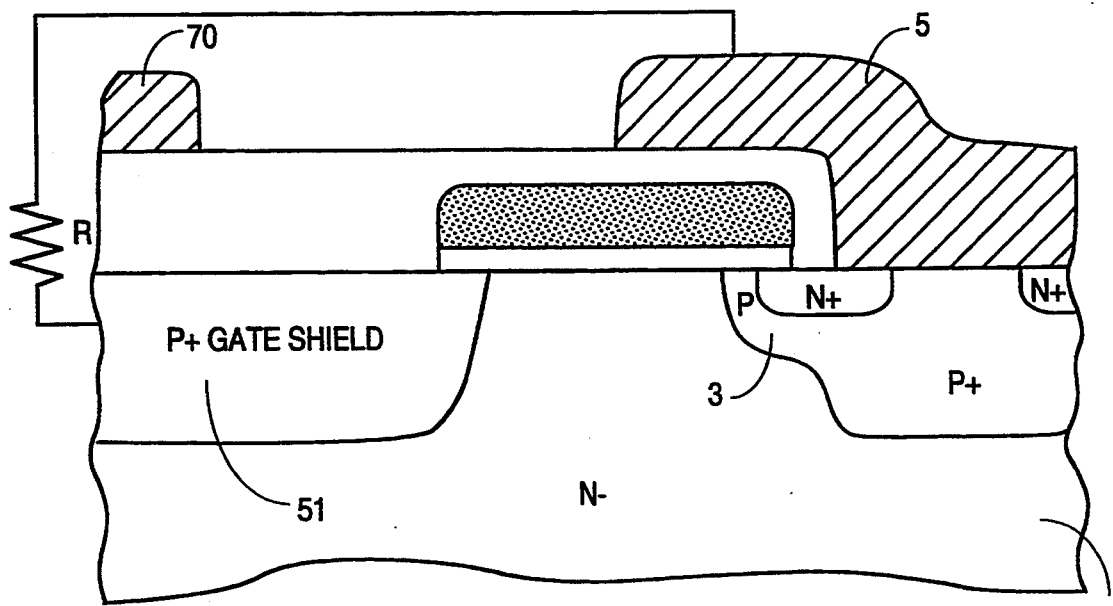
FIG. 8 (PRIOR ART) is a cross-sectional view of a second structure which has conventionally been used in locations such as location A—A in FIG. 5.
Figure 9:
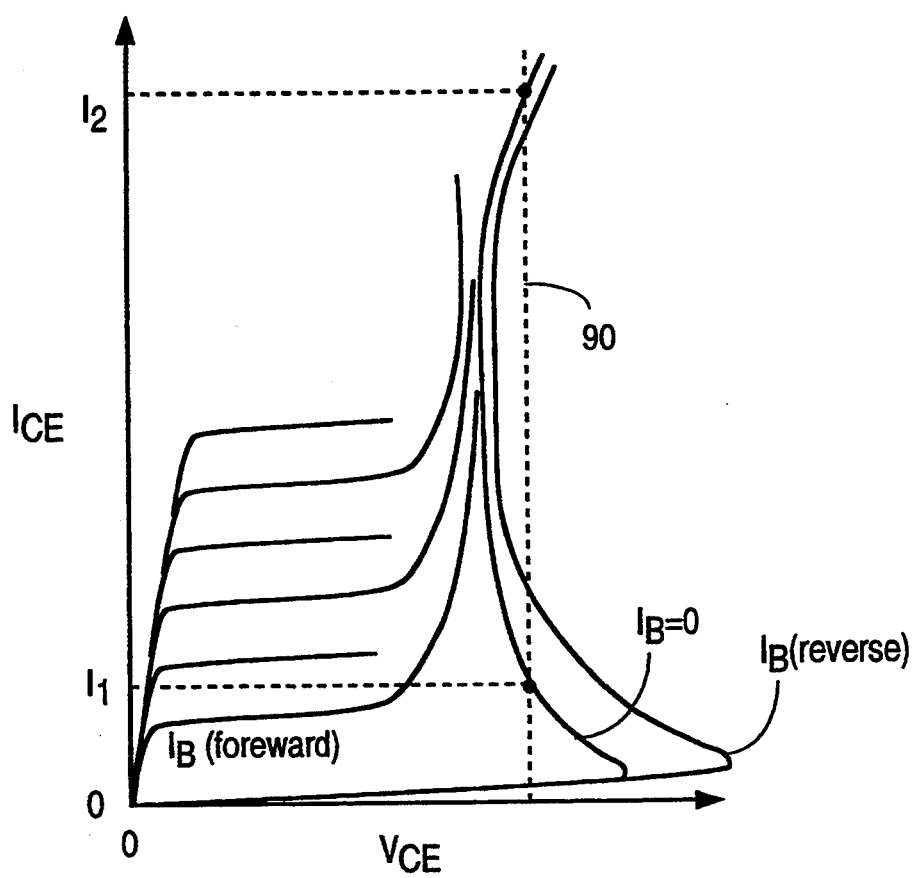
FIG. 9 is a graph showing the operating characteristics of a bipolar transistor.

An insulating layer 1010 is disposed over the polysilicon gate layer 1009 to insulate the polysilicon gate 1009 from an overlying metal source electrode 1011. The overlying metal source electrode 1011 of the present invention may, for example, have the same approximate shape as does the source electrode 41 of FIG. 4. The source electrode 1011 contacts P+ type central body region 1003 of active cell 1102A through one of the plurality of square-shaped windows in thin oxide layer 1008 and polysilicon gate layer 1009. The source electrode in the present invention, however, also makes direct electrical and physical contact with the gate buffer region 1103. In the embodiment shown in FIG. 10, the source electrode 1011 extends from the oxide and polysilicon window over active cell 1102A at the right of FIG. 10, to the left over polysilicon gate layer 1009, and to gate buffer region 1103. A portion of the top surface of gate buffer region 1103 is not covered by oxide so that the source electrode 1011 can make direct contact with the gate buffer region 1103 at the upper surface of the epitaxial layer 1000.

This direct connection of the source electrode 1011 to the top of the gate buffer region 1103 establishes a relatively low impedance connection from the source electrode 1011 to the gate buffer region 1103. A relatively large impedance R, however, is present between the gate shield region 1100 and the source electrode 1011. Relatively large impedance R may, for example, be realized by indirectly connecting the gate shield region 1100 to the source metal via a long and thin portion of field ring 1101 (see FIG. 11) and a contact such as contact 1104 and 1105. It is to be recognized, however, that this relatively large impedance R may be realized with other connection configurations and schemes so long as the impedance R of the configuration is larger than the impedance between the gate buffer region 1103 and the source electrode 1011. Contacts 1104 and 1105 of FIG. 11 are presented merely as one of many possible embodiments of a connection between the gate shield region 1100 and the source electrode 1011. Similarly, other embodiments may be practiced wherein a metal source electrode does not connect directly to the top of the P+ gate buffer region but rather connects to the gate buffer region via another structure of another material.

In FIG. 10, P+ gate buffer region 1103 is laterally spaced from gate shield region 1100 by a distance A and from the peripheral body region of active cell 1102A by a distance B. Distance A should not be significantly greater than distance B because the depletion region which is formed in the structure during reverse bias conditions should extend laterally across the portion of the epitaxial layer 1000 between gate shield region 1100 and gate buffer region 1103 in approximately the same way that the depletion region extends laterally across the separations between successive active cells in the active region.

Figure 13:
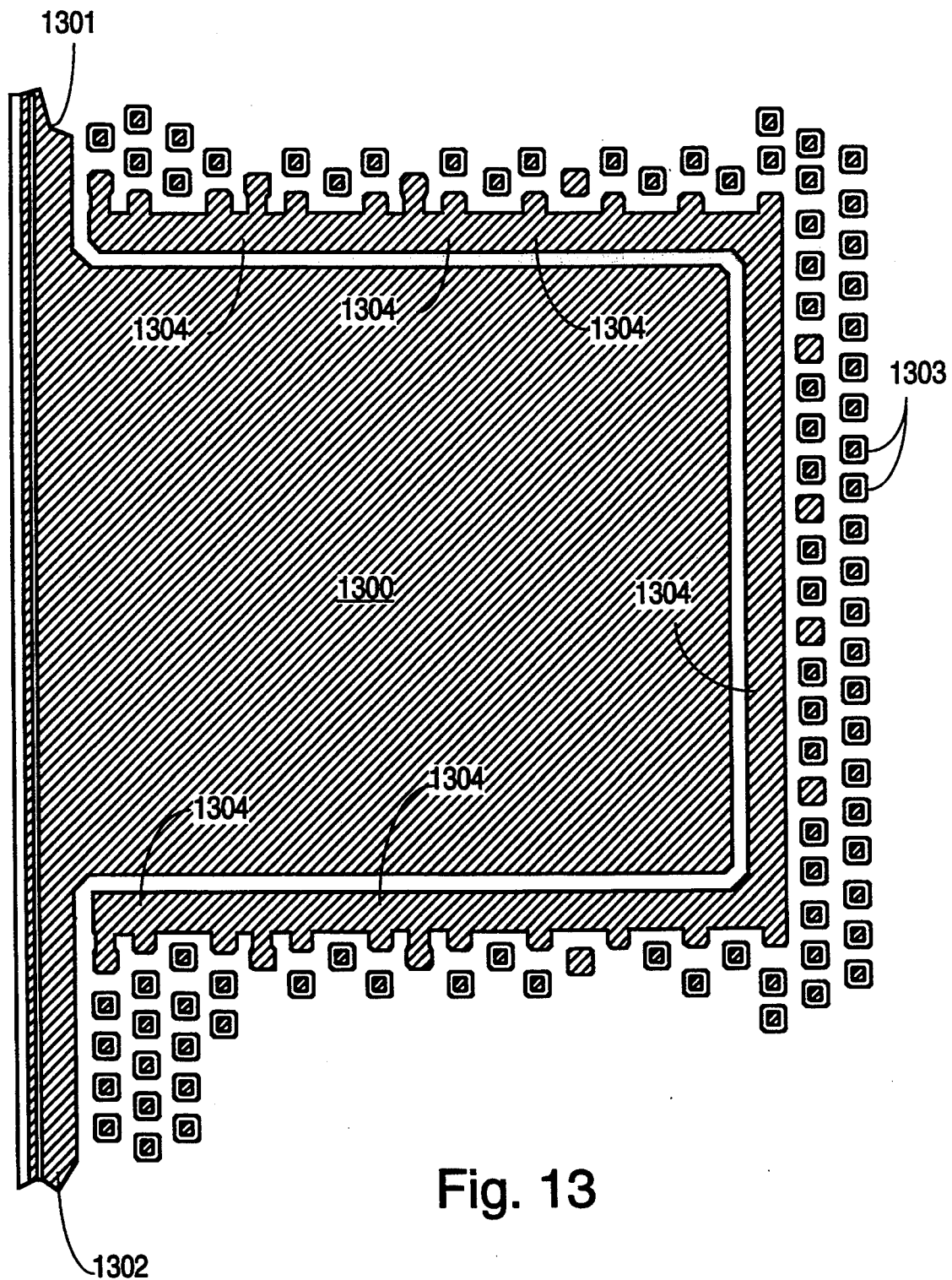
FIG. 13 is a top down view of the gate buffer region and gate shield region of a power device according to one embodiment of the present invention.

FIG. 13 is a top down view of the gate pad area and adjacent active cells of another embodiment of a power device. The shaded layer in FIG. 13 is a P+ diffusion layer. The non-shaded layer in FIG. 13 depicts the upper surface of an N− epitaxial layer into which the P+ diffusions are formed. A substantially rectangular P+ gate shield region 1300 connects to a first end of a P+ field ring 1301 and to a second end of the P+ field ring 1302. The field ring extends around the active region of the power device. A plurality active cells 1303 are disposed over the surface of the active region. The center of each of these active cells has a P+ diffused central body region which appears in FIG. 13 as a shaded spot. The thin line surrounding each of the central P+ type central body regions of the active cells is the top down outline of the P type peripheral body region of the cell. A gate buffer region 1304 is shown disposed between the active cells of the active region and the gate shield region 1300. The gate pad (not shown) of the embodiment of FIG. 13 may or may not have gate fingers which extend over the active region of the power device.

Figure 14:
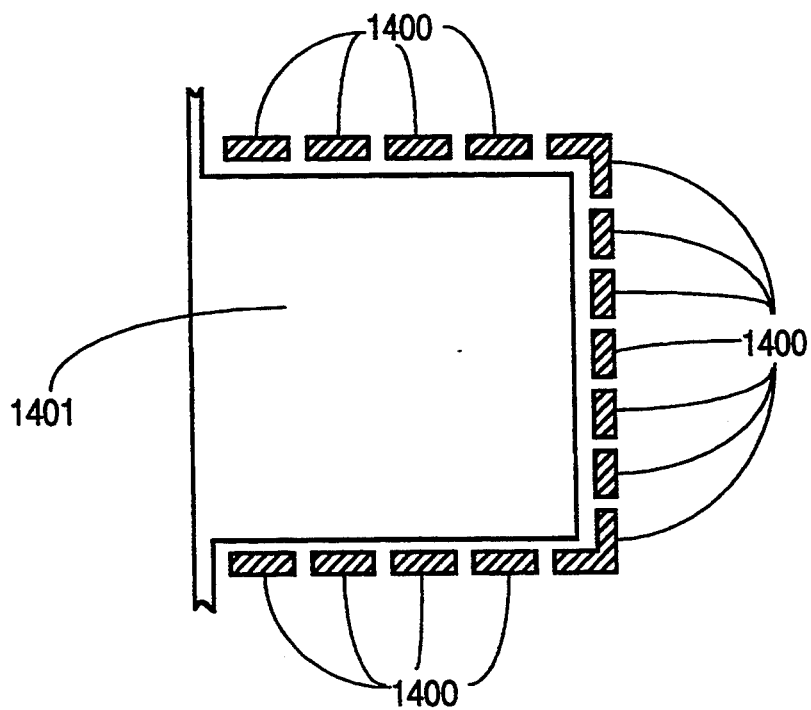
FIG. 14 is a top down view showing another embodiment of the present invention having a plurality of strip-like individual gate buffers.
Figure 16:
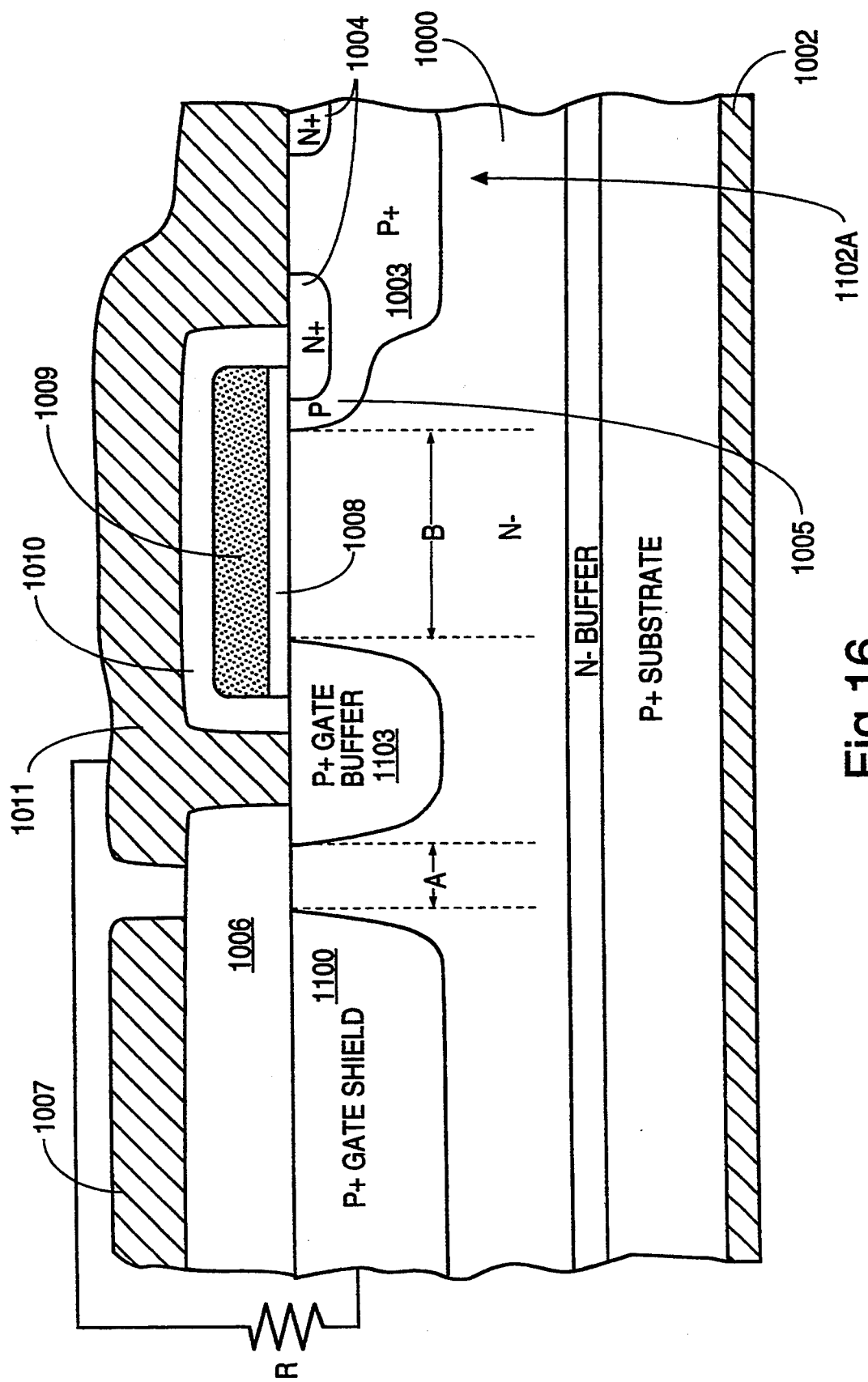
FIG. 16 is a cross-sectional view of an embodiment of the present invention comprising an insulated gate bipolar transistor.

FIG. 14 is a top down view of an embodiment having a large number of individual substantially strip-like shaped gate buffers 1400 arranged so that the individual gate buffers substantially form a row of gate buffers around a gate pad 1401. In some embodiments having a row of gate buffers, the individual gate buffers may have the same approximate size and shape of the active cells in the active region of the power device except that the individual gate buffers lack the internal N+ annular source regions of the active cells.

Figure 15:
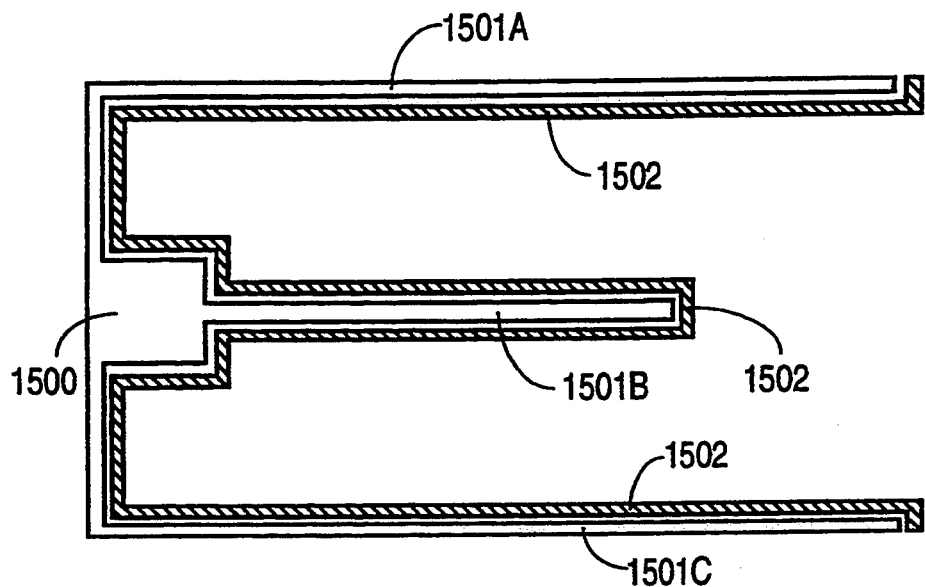
FIG. 15 is a top down view showing another embodiment of the present invention.

FIG. 15 is a top down view showing another embodiment of the present invention. In this embodiment, a gate pad 1500 has three gate fingers 1501A–1501C. The gate shield region (not shown) has the same approximate top down outline as do the overlying gate pad and gate fingers. A band-shaped gate buffer region 1502 is disposed to extend around the gate pad 1500 and the gate fingers 1501A–1501C so that the gate buffer region 1502 is disposed between the active cells in the active region and the gate shield region underneath the gate pad and fingers. It is therefore seen that numerous gate shield region, gate buffer region, and gate pad configurations may be utilized using this invention.

Although this invention has been described by way of the above described embodiments, certain adaptations may be practiced without departing from the scope of the claimed invention. This invention may, for example, be practiced with any active cell configuration including circular cells, and polygonal cells. Polygonal cells may include square cells, rectangular cells, triangular cells, pentagonal cells, hexagonal cells, octagonal cells, et cetera. A doubly-diffused active cell cross-sectional contour need not be used to practice this invention. Moreover, long stripe-shaped active structures may be utilized in the active region of the power device. The invention may be modified for realization using other semiconductor processes. The source, gate, and/or drain electrodes and layers may, for example, be replaced with other types of conductors utilized in these other processes. The above description of the preferred embodiments is, therefore, presented merely for instructional purposes and is not intended to limit the scope of the invention as set forth in the appended claims.

I claim:

1. A power device having a gate pad region and an active region, comprising:
    a semiconductor body of a first conductivity type, said semiconductor body having an upper surface;
    an insulator layer disposed over said upper surface of said semiconductor body in said gate pad region;
    a gate pad disposed over said insulator layer in said gate pad region;
    a gate shield region disposed underneath said gate pad, said gate shield region extending from said upper surface into said semiconductor body, said gate shield region being of a second conductivity type opposite said first conductivity type, said gate shield region being separated from said gate pad in said gate pad region by said insulation layer; and
    a gate buffer region disposed at least partly between said active region and said gate shield region, said gate buffer region being laterally spaced from said gate shield region, said gate buffer region extending from said upper surface into said semiconductor body, said gate buffer region being of said second conductivity type.

2. The power device of claim 1, further comprising:
    a source electrode disposed at least partly over said active region, said source electrode extending at least partly over said gate buffer region and making electrical contact with said gate buffer region at said upper surface of said semiconductor body.

3. The power device of claim 2, wherein an impedance between said gate buffer region and said source electrode is smaller than an impedance between said gate shield region and said source electrode.

4. The power device of claim 2, further comprising:
    a gate finger extending over said active region from said gate pad.

5. The power device of claim 2, wherein said gate buffer region has a narrow substantially strip-like shape.

6. The power device of claim 2, wherein said gate buffer region comprises a row of a plurality of buffer regions, each of said buffer regions extending from said upper surface into said semiconductor body, each of said buffer regions being of said second conductivity type, wherein said row of buffer regions is disposed at least partly between said active region and said gate shield region.

7. The power device of claim 2, wherein said power device is a power field effect transistor structure.

8. The power device of claim 2, wherein said power device is an insulated gate bipolar transistor structure.

9. The power device of claim 2, wherein said gate shield region has a bottom surface, said bottom surface of said gate shield region having a first surface area, and wherein said gate buffer region has a bottom surface, said bottom surface of said gate buffer region having a second surface area, said second surface area being substantially smaller than said first surface area.

10. The power device of claim 2, wherein said semiconductor body comprises a layer of epitaxial silicon.

11. The power device of claim 2, further comprising an active cell located in said active region adjacent to said gate buffer region, a first separation existing between said gate shield region and said gate buffer region, a second separation existing between said gate buffer region and said active cell, said first separation being approximately equal to said second separation.

12. The power device of claim 2, further comprising a field ring integrally formed with said gate shield region, said field ring at least substantially laterally surrounding said active region, a contact coupling said field ring to said source electrode at a location remote from said gate shield region.

13. The power device of claim 1, further comprising a gate electrode separated from said upper surface of said semiconductor body by a layer of gate oxide, said layer of gate oxide being thinner than said insulator layer in said gate pad region.

14. The power device of claim 13, wherein said gate buffer region underlies a part of said insulator layer in said gate pad region and also underlies a part of said gate electrode.

15. A power device having a gate pad region and an active region, comprising:
    a gate shield region disposed in said gate pad region;

a doubly-diffused field effect transistor cell disposed in said active region; and means for buffering current from flowing from under said gate shield region to said cell, a source electrode coupled both to said cell and also to said means for buffering, said means for buffering being laterally spaced from both said gate shield region and from said cell.

* * * * *